United States Patent [19]

Knierim

[11] Patent Number: 4,733,220

[45] Date of Patent: Mar. 22, 1988

[54] THERMOMETER-TO-ADJACENT BINDARY ENCODER

[75] Inventor: Daniel G. Knierim, Beaverton, Oreg.

[73] Assignee: Tektronix, Inc., Beaverton, Oreg.

[21] Appl. No.: 920,936

[22] Filed: Oct. 20, 1986

Related U.S. Application Data

[63] Continuation of Ser. No. 784,414, Oct. 4, 1985.

[51] Int. Cl.[4] .................... H03M 1/36; H03M 7/16
[52] U.S. Cl. .................. 340/347 DD; 340/347 AD
[58] Field of Search ............... 340/347 DD, 347 AD

[56] References Cited

U.S. PATENT DOCUMENTS 3,518,663 6/1970 Oddo ........................ 340/347 DD
3,676,687 7/1972 Freedman ............... 340/347 DD X
3,806,915 4/1974 Higgins ...................... 340/347 AD
4,081,830 3/1978 Mick ..................... 340/347 AD UX Primary Examiner—Charles D. Miller
Attorney, Agent, or Firm—John P. Dellett; George T. Noe

[57] ABSTRACT

An encoder circuit converts a thermometer code into an equivalent adjacent binary code wherein only a single bit is changed to minimally increment or decrement the value of the binary code. The encoder logic is grouped so that the state of any single bit of the thermometer code can affect the state of one and only one bit of the binary code whereby when any least significant thermometer code bit is at an invalid logic level, the invalid level is propagated through the encoder circuit to only a single, least significant binary code bit, without the introduction of any logical errors. The invalid binary code bit is then stabilized to a valid level by one or more latches.

7 Claims, 2 Drawing Figures

THERMOMETER-TO-ADJACENT BINDARY ENCODER

This is a continuation of application Ser. No. 784,414 filed Oct. 4, 1985, now abandoned.

BACKGROUND OF THE INVENTION

The present invention relates in general to encoding circuits and in particular to a method and apparatus for converting thermometer code to adjacent binary code.

A number may be represented by a thermometer code wherein each successive bit of a data word is assigned a progressively larger value, all of the bits having assigned values below or the same as the number being set to a logical true state, and all of the bits having values higher than the number being set to a logical false state. In a typical analog-to-digital (A/D) converter, a reference voltage is divided into a set of progressively larger reference voltage quantum levels and a comparator associated with each quantum level compares an analog input voltage with the voltage quantum, generating an output true state if the input voltage is higher than the voltage quantum reference. The outputs of all of the comparators thus form the bits of a thermometer code representing the magnitude of the input voltage when arranged in order of the associated reference voltage quantum level magnitudes.

In comparison to most other commonly used codes, thermometer codes do not represent numbers efficiently in terms of the number of bits required. For instance an eight bit thermometer code can represent any one of 9 different numbers (including 0) while a typical eight bit binary code can represent 256 different numbers. Therefore the thermometer code output of an A/D converter is usually converted by an encoding circuit to another more compact and useful binary code before being transmitted as data to external circuits.

A problem arises when one or more of the bits of a thermometer code are at an invalid logic level, intermediate in voltage between high and low logic levels, causing instability in the output of one or more of the output bits of a thermometer-to-binary code conversion circuit. For instance, the output of each comparator of an A/D converter is ideally either high or low, depending on the magnitude of the input voltage, but in practice one comparator of the A/D converter may produce an invalid level output which is neither of high nor low logic level when the input voltage is sufficiently close to the reference voltage applied to the comparator. Also, if the input voltage is slewing rapidly past several reference voltages, several comparator outputs may be invalid simultaneously. To prevent invalid bits from being propagated through the code conversion circuit, the thermometer code output of an A/D converter is typically applied to a set of clocked latches having positive feedback circuits to drive their outputs to stable high or low logic levels if their inputs are invalid. The stabilized output of each latch is then applied to the code conversion circuit.

It is possible, though, for one of the latches to remain at an invalid or "metastable" logic state for a considerable period of time before the positive feedback circuit causes the output to regenerate to a valid level. This invalid logic bit can typically cause logical errors in the encoding circuit, producing an output code not representative of the input voltage applied to the A/D converter. Thus the sampling rate of a typical A/D converter using this approach is limited, since sufficient time must be allowed for the latches to fully regenerate. The use of multi-stage latch "pipelines" between the comparators and the code conversion circuit has permitted higher frequency operation since each latch in the pipeline helps drive a metastable input to a stable state without having to completely switch states during a single clock cycle. However, this solution is hardware intensive, requiring multiple latches for each bit of the thermometer code, and the frequency of operation is still somewhat limited by the limited number of pipeline stages that can be practically realized.

What would be useful would be a method and apparatus which would rapidly convert a thermometer code subject to metastable level bits to a more compact code without introducing logical errors from the invalid input bits. The compact code could then be "pipelined" to remove metastable bits at much lower cost.

SUMMARY OF THE INVENTION

According to one aspect of the invention, an encoder converts a thermometer code into a nonweighted adjacent binary code (e.g., the well known Gray code) wherein only a single bit is changed to minimally increment or decrement the value of the code. The encoder logic is arranged in such a fashion that a metastable state in any one thermometer code bit is propagated to only a single, least significant binary code bit, i.e., the bit which if changed would cause the magnitude of the number represented by the code to change by the least amount. The metastable binary code bit is then stabilized by a latch or a latch pipeline. The number of latches required is substantially reduced; the prior art requires multiple latches for each input thermometer code bit to obtain high-speed operation, while the present invention requires only one latch for each thermometer code bit, with multiple latches provided only for the substantially fewer output binary code bits of the conversion circuit.

It is therefore an object of the present invention to provide a new and improved method and apparatus for converting a thermometer code to a binary code.

It is another object of the present invention to provide a new and improved thermometer-to-binary encoder in which a least significant metastable thermometer bit will propagate its metastability to only a single, least significant bit of an equivalent binary code.

It is a further object of the present invention to provide an analog-to-adjacent binary code converter capable of high speed operation.

The subject matter of the present invention is particularly pointed out and distinctly claimed in the concluding portion of this specification. However, both the organization and method of operation, together with further advantages and objects thereof, may best be understood by reference to the following description taken in connection with the accompanying drawings wherein like reference characters refer to like elements.

DETAILED DESCRIPTIOIN

Figure 1:
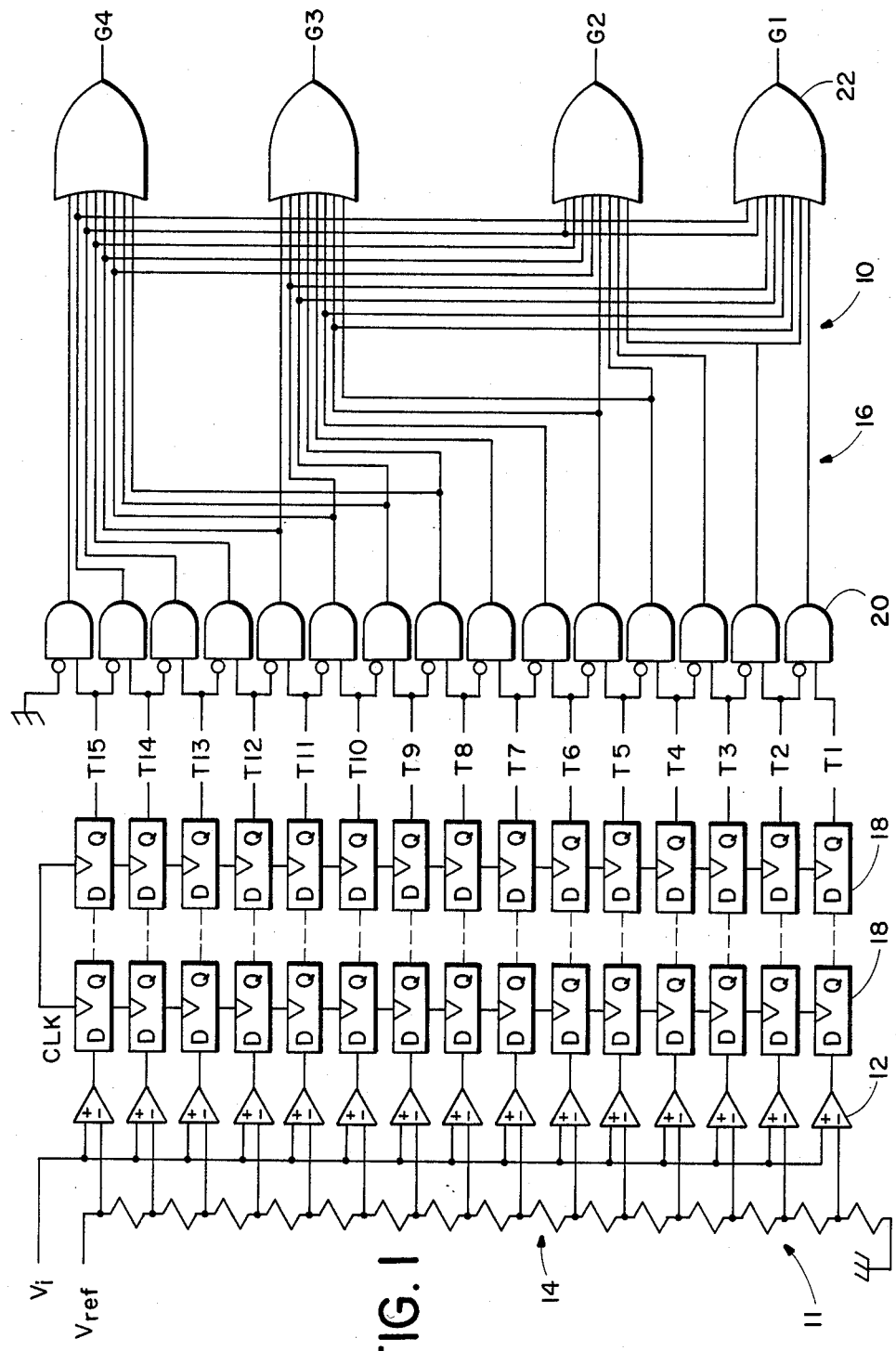
FIG. 1 is an analog-to-Gray code converter of the prior art.

Referring to FIG. 1, there is depicted in block diagram form, an analog-to-digital converter 10 of the prior art adapted to convert an analog voltage signal to a four bit Gray code signal of equivalent magnitude. The converter 10 comprises an analog-to-thermometer code converter 11, a thermometer-to-Gray encoder 16, and a set of latches 18 coupling the output of the code converter 11 to the input of the encoder 16.

A number may be represented by a thermometer code wherein each successive bit of a data word is assigned a progressively larger value, all of the bits having assigned values below or the same as the number being set to a logical true (e.g. high logic level) state and all of the bits having values above the number being set to a logical false (e.g. "low" logic level) state. Table I lists the decimal values associated with each allowable state of an eight bit thermometer code.

TABLE I

| Decimal | Thermometer | Decimal | Thermometer |
|---------|-------------|---------|-------------|
| 0       | 00000000    | 5       | 00011111    |
| 1       | 00000001    | 6       | 00111111    |
| 2       | 00000011    | 7       | 01111111    |
| 3       | 00000111    | 8       | 11111111    |
| 4       | 00001111    |         |             |

The Gray code is a well known non-weighted, adjacent binary code wherein only one bit is changed to increment or decrement the value of a number represented by the code. Table II lists the decimal values of all combinations of a four bit Gray code.

TABLE II

| DEC | GRAY | DEC | GRAY |
|-----|------|-----|------|
| 0   | 0000 | 8   | 1100 |
| 1   | 0001 | 9   | 1101 |
| 2   | 0011 | 10  | 1111 |
| 3   | 0010 | 11  | 1110 |
| 4   | 0110 | 12  | 1010 |
| 5   | 0111 | 13  | 1011 |
| 6   | 0101 | 14  | 1001 |
| 7   | 0100 | 15  | 1000 |

The least significant bit of a code is defined as the bit which if changed would cause the magnitude of the number represented by the code to change by the least amount. As can be seen from table II, unlike weighted, non-adjacent binary codes, the least significant bit of a Gray code word is not always in the same bit position and there may be more than one least significant bit in the word. For instance in Gray code 0110, the rightmost bit and the second bit from the left are both least significant bits. In contrast, the rightmost and leftmost bits are both least significant in Gray code 0100.

Referring again to FIG. 1, the analog-to-thermometer code conversion circuit 11 comprises a set of fifteen comparators 12 and a voltage divider network 14. An analog voltage signal Vin to be sampled is applied to a non-inverting input of each of the comparators 12 while a reference voltage Vref is applied to the voltage divider network 14, thereby producing progressively lower reference voltage quantum levels applied to inverting inputs of each comparator. Each comparator 12 includes a difference amplifier having an output which saturates to a high (logical 1) comparator output state if the input voltage is sufficiently higher than its voltage reference level or saturates to a low (logical 0) logic level output state if the input voltage is sufficiently lower than its reference voltage. For instance, if the input voltage is higher than the reference voltage applied to the 5th comparator (i.e., the comparator producing the 5th lowest order thermometer code bit T5) but less than the reference voltage applied to the 6th comparator, the outputs of the 1st through the 5th comparators (T1–T5) will all be high while the outputs of the 6th through the 15th comparators (T6–T15) will all be low. The outputs (T1 through T15) of all of the comparators 12 thus collectively appear as a fifteen bit thermometer code representing the magnitude of the input voltage Vi as any one of sixteen discrete numbers, including 0.

The thermometer code output of the converter circuit 11 is latched onto the input of the encoding circuit 16 on receipt of a CLK signal by the latches 18. The encoding circuit 16, which converts the thermometer code to a more compact and useful Gray code, comprises AND gates 20 and OR gates 22, one AND gate corresponding to each thermometer code input bit and one OR gate corresponding to each Gray code output bit. Each thermometer code bit output from a latch 18 is applied to a non-inverting input of the corresponding AND gate 20 and to an inverting input of the AND gate 20 associated with the next lower order thermometer code bit, if any. The inverting input of the AND gate receiving code bit T15 is grounded. The outputs of the fifteen AND gates 20 are connected to inputs of the OR gates 22 such that the output of one OR gate 22 comprises the first (rightmost) bit G1 of the Gray code corresponding to the thermometer code appearing at the conversion circuit input while the outputs of the other gates comprise the second through the fourth bits G2–G4 of the Gray code. More specifically, the AND gates 20 and OR gates 22 are interconnected to effect the following Boolean relations between the bits of the thermometer and Gray codes, where the "*" symbol represents an AND function, the "+" symbol represents an OR function, and the /symbol preceding a bit reference character indicates a NOT function:

G1=(T1*/T2)+(T2*/T3)+(T5*/T6)+(T6*/T7)-+(T9*/T10)
+(T10*/T11)+(T13*/T14)+(T14*/T15)

G2=(T2*/T3)+(T3*/T4)+(T4*/T5)+(T5*/T6)-+(T10*/T11)
+(T11*/T12)+(T12*/T13)+(T13*/T14)

G3=(T4*/T5)+(T5*/T6)+(T6*/T7)+(T7*/T8)-+(T8*/T9)+(T9*/T10)+(T10*/T11)+(T11*/-T12)

G4=(T8*/T9)+(T9*/T10)+(T10*/T11)+(T11*/-T12)+(T12*/T13)+(T13*/T14)+(T14*/T15)+-(T15)

If the analog input voltage Vi is insufficiently larger or smaller than the quantum reference voltage applied to any one of the comparators 12, the comparator output will be at an invalid logic level, neither high nor low, but at an intermediate level wherein minor variations of the input or reference voltages will swing the comparator output to either its high or low level output state. Also, if the analog input voltage is slewing past the reference quantum levels at a rate faster than the response time of the comparators, one or more comparator outputs may be simultaneously in an intermediate invalid state as they switch from a low to high level, or vice versa. Latches 18 are provided to stabilize any invalid thermometer code bit before applying the bit to the logic gate portion of encoder 16. Each latch is of the type having a positive feedback circuit such that the output will be driven to its high logic level state if its input voltage is slightly larger than a threshold voltage and will be driven to its low logic level state if its input voltage is slightly smaller than the threshold voltage. Thus an invalid thermometer code bit generated by a comparator 12 will be stabilized at the output of the corresponding latch 18 following application of the CLK signal.

If the thermometer code output of the comparators 12 were applied directly to the AND gates 20 without being latched, an invalid bit in the thermometer code would propagate through the encoder circuit 16 and from one to all four of the Gray code bits would be invalid. For instance if T13 were invalid, G1, G2 and G4 would all be invalid. The Gray code bits could be stabilized by latches placed after the encoding circuit, but the resulting Gray code would be subject to intolerable errors depending on which states each invalid Gray code bit happened to assume when latched. It is therefore necessary in this prior art arrangement that latches 18 appear between the comparators 12 and the encoding circuit 16 to stabilize the thermometer code, rather than after the encoding circuit to latch the Gray code.

While latches 18 stabilize the converter 10 output bits, the latches limit the operating speed of the converter. The CLK cycle must be long enough for the feedback circuits in the latches to drive the latch outputs to stable high or low states. This occurs quickly in most cases, but if one of the latch inputs is extremely close to its threshold level, the latch may sit in a "metastable" state for a considerable period of time before regenerating to a valid high or low level. In order to avoid such an error propagating to the Gray code outputs, the clock cycle must be made long enough to allow even the "metastable" latch to fully regenerate. Some speed improvement can be had by replacing each latch 18 in FIG. 1 with a series of latches wherein successive thermometer code outputs associated with each waveform sample are transmitted from latch to latch in a pipeline fashion. The clock rate may be too high for any one latch to drive a metastable bit to a stable state, but each successive latch drives the bit to a progressively more stable state. If enough latch stages are provided, the bit will normally stabilize by the time it reaches the output of the last stage. Unfortunately the pipeline approach requires the use of a large number of latches, one set for each thermometer code bit.

Figure 2:
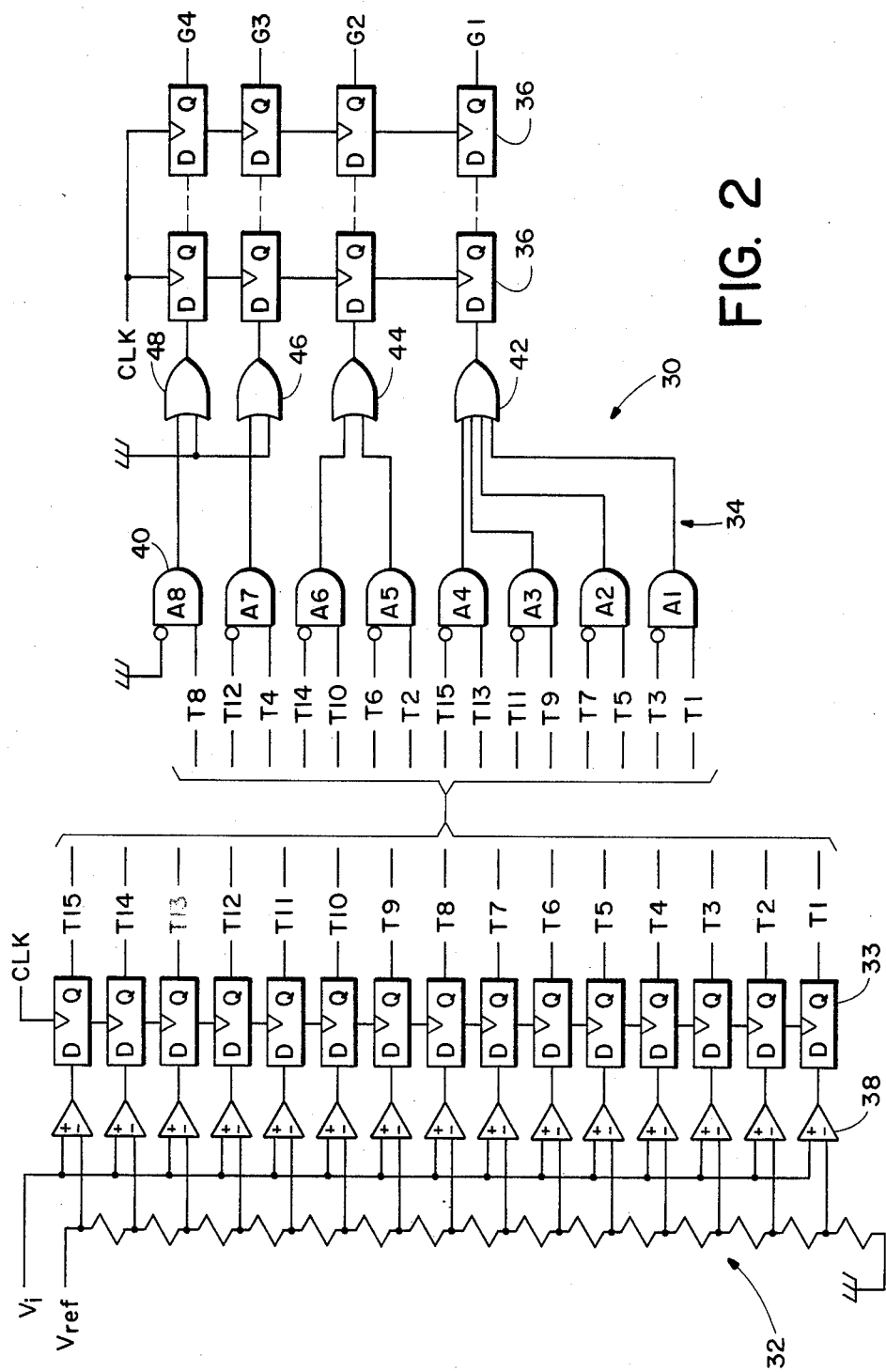
FIG. 2 is an analog-to-Gray code converter according to the present invention.

Referring to FIG. 2 there is depicted in block diagram form an analog-to-digital converter 30, adapted to convert the instantaneous magnitude of a sampled waveform Vi to a representative Gray code, the converter comprising an analog-to-thermometer code conversion circuit 32, a set of latches 33, a thermometer-to-Gray code encoder 34 according to the present invention, and a latch pipeline 36, consisting of one or more latches per output bit. Conversion circuit 32 is similar in construction to the conversion circuit 11 and operates in a similar fashion to produce a fifteen bit thermometer code representing the magnitude of the sampled waveform Vi at the output terminals of a set of comparators 3B.

Encoder circuit 34 comprises a set of AND gates 40 (labeled A1 through A8), a first OR gate 42, a second OR gate 44, a third OR gate 46 and a fourth OR gate 48. The AND gates 40 each have a non-inverting and an inverting input and the first bit T1 of the thermometer code is applied to the non-inverting input of AND gate A1 while the third bit T3 is applied to the inverting input of A1. In a similar fashion, bits T5 and T7 are applied to non-inverting and inverting inputs respectively of A2, bits T9 and T11 are applied to the two inputs of A3, bits T13 and T15 are applied to A4, bits T2 and T6 are applied to A5, bits T10 and T14 are applied to A6, bits T4 and T12 are applied to A7. Bit T8 is applied to the non-inverting input of A8 while the inverting input of A8 is grounded. The outputs of A1 through A4 are connected to separate inputs of OR gate 42 while the outputs of A5 and A6 are connected to separate inputs of OR gate 44. The output of A7 is applied to an input of OR gate 46 and the output of A8 is connected to an input of OR gate 48. The outputs of gates 42, 44, 46 and 48 comprise the first, second, third and fourth bits G1 through G4 of the Gray code corresponding to the thermometer code input, and each bit of the Gray code is latched on occurrence of a CLK pulse by a separate latch 36. It should be noted that OR gates 46 and 48 could be any kind of gate or device which would delay an input signal by the same amount as OR gates 42 and 44 without changing the state of the input signal.

The encoder circuit 34 converts the thermometer code into an adjacent binary code wherein only a single bit of the code is changed to minimally increment or decrement the value of any number represented by the code. In the preferred embodiment of the invention, as illustrated in FIG. 2, the adjacent binary code comprises the well known Gray code, but other types of adjacent binary codes may be used. The encoder circuit 34 of FIG. 2 converts the thermometer code to the Gray code according to the following Boolean expressions:

$$G1 = (T1^*/T3) + (T5^*/T7) + (T9^*/T11) + (T13^*/T15)$$

$$G2 = (T2^*/T6) + (T10^*/T14)$$

$$G3 = (T4^*/T12)$$

$$G4 = T8$$

The above Boolean expressions can be easily derived from Table II in the following manner. The expression for Gray code first bit G1 can be derived by observing the changes in the first bit on the right side of the Gray code in Table II as the corresponding thermometer code is increased in magnitude. The first bit goes high when the thermometer code reaches the value of 1, i.e., when bit T1 of the thermometer code goes high. The Gray code first bit goes low again when the thermometer code reaches 3. This observation is reflected by the first term of the expression for G1 above: G1 goes high when T1 is high while T3 is low. The first bit of the Gray code also goes high when T5 goes high and goes low again when T7 goes high. This is reflected by the second term for the G1 expression, comprising another situation wherein G1 is high. The first and second terms of the G1 expression are therefore logically ORed. The other terms for G1 can be established in the same fashion by observing the points at which the first bit of the Gray code turns on and off as the code is increased. The expression for G2 is established in the same fashion by observing how the second rightmost bit of the Gray code changes as the code is increased in magnitude. For instance, the first term for G2 indicates that the second bit goes high when T2 goes high and goes low when T6 goes high. The expressions for the third and fourth bits G3 and G4 of the Gray code are established in a similar fashion. The same method can be used to establish similar Boolean expressions for each bit of any adjacent binary code and an encoding circuit can be constructed to implement the Boolean expressions so established.

One feature of Boolean expressions established by this method is that each thermometer code bit appears in the Boolean expression for one and only one of the adjacent binary code bits. Although there are many possible sets of Boolean expressions correctly relating thermometer codes to adjacent binary codes, this feature is not universal to all such expression sets. This feature is useful when the Boolean expressions are implemented in the form of an encoder circuit 34 as in FIG. 2 for converting the thermometer code output of a converter circuit to an adjacent binary code when one bit of the thermometer code may be unstable. While a metastable bit in the thermometer code may propagate through to the Gray code, unlike the prior art encoder circuit 16 of FIG. 1, encoder circuit 34 will propagate a metastable thermometer code bit to only a single Gray code bit. This is easily seen by noting that in the above Boolean expressions, each individual thermometer code bit appears in only one of the Gray code bit expressions and therefore each thermometer code bit can affect only a single Gray code bit. Moreover, although not so readily apparent, the single Gray code bit which becomes metastable in response to a metastable thermometer code bit will always be a least significant bit. As long as the metastable bit is the least significant bit of the thermometer code, if the bit were to stabilize in a high state, the Gray code would represent a next higher number than it would represent if the code were to stabilize in a low state. It follows that if the metastable bit can only affect a single bit of the corresponding Gray code, then the affected Gray code bit must also be a least significant bit.

Latches 33 of FIG. 2 are placed between the converter circuit 32 output and the encoder circuit 34 input to ensure that at most only one least significant bit of the thermometer code will be invalid at the input of the encoder circuit. It is possible for more than one converter 32 output to be at an invalid level at the time it is clocked into the latches 33, if the input signal Vi is rapidly changing, since each comparator 38 requires a certain amount of time to fully change its output state between high and low logic levels. However if the regeneration rate of each latch 33 is sufficiently fast with respect to the clock frequency, only one thermometer code bit extremely close to the latch threshold level can remain metastable after being latched. Assuming that the input signal rapidly changes from a maximum level to a minimum low level, every comparator 38 must change its output state. If the latches 33 are clocked while the comparators are changing state, and if the comparators are similar in construction, then the magnitudes of the comparator output bits when the latches are clocked can be expected to vary from the lowest to the highest magnitude bit in an evenly spaced manner and at most only one of the bits will have a magnitude which is sufficiently close to the latch threshold level to remain metastable until the next clock. Consequently only that one invalid bit can be propagated through to the Gray code output of the encoder at the time the output latches 36 are operated.

Assuming the gain of each thermometer code latch is G (typically proportional to $e^{t/r}$ where f is the frequency of the latch clock and where r is the regeneration time constant of each latch), then if the input signal is rapidly changing, the probability that a single bit will remain invalid after latching is $N/(G^n)$ where N is the number of bits in the thermometer code which may be simultaneously invalid (i.e., still slewing from the old to the new logic state) and n is the total number of latch pipeline stages that a thermometer code bit passes through to reach the encoder circuit. As a typical example, if N is 16, G is 100, and n is one, then an unstable bit can occur on 16 out of 100 clock cycles. In the circuit of the prior art, as depicted in FIG. 1, a single invalid bit may affect several bits in the Gray code, and therefore may cause a large error in the Gray code output of the circuit.

Since large errors of this sort cannot be tolerated with probabilities anywhere near this high, the prior art converter must either use a plurality of thermometer code latches 18 in a pipeline fashion for each bit of the thermometer code (i.e., increase n) or lower the frequency of operation of the converter (i.e., increase G by decreasing f).

However, with reference to the circuit of FIG. 2 according to the present invention, use of only a single thermometer code latch 33 is necessary to avoid substantial errors in the Gray code output without any reduction in clock frequency. As discussed hereinabove, a single latch ensures that at most only a single, least significant bit of the thermometer code applied to the encoder circuit 34 will be at an invalid level, while use of the particular encoding method of encoder circuit 34, ensures that the invalid bit will be propagated only to a single, least significant bit of the resulting Gray code. Since only a single bit of the Gray code can become metastable at any time, and since that bit is least significant, the bit may be stabilized by a corresponding latch pipeline 36 placed at the output of the encoder circuit 34 rather than by latches placed at its input, as in the prior art, without causing large errors in the Gray code result. The ability to place the latch pipelines at the output of the encoder circuit 34 rather than at the input is advantageous because far fewer latches are required, there being fewer bits in the Gray code output than in the thermometer code input.

In addition to a reduction in the number of latches required, it will also be appreciated that the encoder circuit 34 of the present invention requires only about half of the gates required by the prior art encoder circuit 16 of FIG. 1, the output stage OR gates require only half of the fanin as the output stage OR gates of circuit 16, and each thermometer code bit drives only a single load instead of two.

While a preferred embodiment of the present invention has been shown and described, it will be apparent to those skilled in the art that many changes and modifications may be made without departing from the invention in its broader aspects. For instance, while the preferred embodiment of the encoder circuit 34 has been described for use in converting a fifteen bit thermometer code into a four bit Gray code, encoder circuit 34 may be adapted to convert thermometer codes of different lengths to Gray codes of correspondingly different lengths.

Further, while the preferred embodiment of the present invention is adapted to generate the well known Gray code, the encoder circuit may be easily adapted to produce other non-weighted adjacent binary codes according to the Boolean expressions established by the method previously described wherein each input thermometer code bit affects one and only one output binary code bit.

Finally, while the encoder circuit 34 has been illustrated for use in conjunction with an analog-to-digital converter, the encoder circuit 34 is also suitable for use in conjunction with other circuits producing thermometer codes, particularly when the least significant bit of the thermometer code is subject to metastability.

I claim:

1. An encoder for converting a plurality of first digital signals into a plurality of second digital signals, each said first digital signal representing a bit of a thermometer code and each said second digital signal representing a bit of a corresponding adjacent binary code, said encoder comprising:

a plurality of first regenerating means, one corresponding to each of said first signals, for regenerating said first digital signals, thereby to produce a set of third digital signals, said third digital signals being grouped into signal subsets, one said signal subset corresponding to each of said second digital signals, and each of said third digital signals being grouped into only one of said signal subsets;

means associated with each said digital signal subset for generating a corresponding fourth digital signal, the state of each said fourth digital signal being determined by the collective states of said corresponding signal subset such that said fourth digital signals in combination represent an adjacent binary code corresponding to the thermometer code represented by said first digital signals; and second regenerating means for regenerating said fourth digital signals, thereby to produce said second digital signals, said second regenerating means comprising a plurality of regeneration stages, each stage producing a set of output signals by regenerating a set of input signals, the stages being serially connected to form a pipeline such that the input signals to each stage other than a first stage of said pipeline comprise the output signals produced by a preceding stage of the pipeline, the fourth digital signals being applied as input signals to said first stage, the second digital signals being generated by a last stage of said pipeline.

2. An encoder as in claim 1 wherein each said subset consists of third digital signals each representing a bit of said thermometer code, wherein a change of state thereof, when it is a least significant bit of the thermometer code, results in a change in state of the binary code bit corresponding to said subset.

3. An encoder as in claim 2 wherein said adjacent binary code comprises a Gray code.

4. An encoder for converting a plurality of first digital signals into a plurality of second digital signals, each said first digital signal representing a bit of a thermometer code and each said second digital signal representing a bit of a corresponding adjacent binary code, said encoder comprising:

a plurality of first regenerating means, one corresponding to each of said first digital signals, for regenerating said first digital signals, thereby to produce a set of third digital signals;

a plurality of logic gates each having two inputs, each input receiving a unique one of said third digital signals such that each said gate produces an output signal of a state determined by the collective states of its two input signals, each said logic gate output signal being grouped into one and only one of a plurality of signal subsets, each said subset corresponding to a separate one of said second digital signals;

means associated with each one of said logic gate output signal subsets for generating a corresponding fourth digital signal of a state determined by the collective states of said signals in said one of said subsets; and second regenerating means for regenerating said fourth digital signals, thereby to produce said second digital signals, said second regenerating means comprising a plurality of regeneration stages, each stage producing a set of output signals by regenerating a set of input signals, the stages being serially connected to form a pipeline such that the input signals to each stage other than a first stage of said pipeline comprise the output signals produced by a preceding stage of the pipeline, the fourth digital signals being applied as input signals to said first stage, the second digital signals being generated by a last stage of said pipeline.

5. An encoder as in claim 4 wherein said logic gates comprise AND gates with one input logically inverted and wherein at least one of said means associated with said logic gate output signal subsets comprises an OR gate, said logic gate signals of said subset associated with said OR gate being applied to separate inputs of said OR gate.

6. An encoder as in claim 5 wherein said binary code comprises a Gray code.

7. An encoder for converting a plurality of first digital signals into a plurality of second digital signals, each of said first digital signals representing a separate bit of a thermometer code and each of said second digital signals representing a separate bit of an adjacent binary code, said encoder comprising:

a plurality of logic gates each having two inputs, each input receiving a unique one of said first digital signals such that each said gate produces an output signal of a state determined by the collective states of its two input signals, each logic gate output signal being grouped into one of and only one of a plurality of signal subsets, each of said signal subsets corresponding to a separate one of said second digital signals;

means associated with each one of the logic gate output signal subsets for generating a corresponding third digital signal of a state determined by the collective states of said signals in said one of said subsets; and means for regenerating said third digital signals, thereby to produce said second digital signals, said means for regenerating comprising a plurality of regeneration stages, each stage producing a set of output signals by regenerating a set of input signals, the stages being serially connected to form a pipeline such that the input signals to each stage other than a first stage of said pipeline comprise the output signals produced by a preceding stage of the pipeline, the third digital signals being applied as input signals to said first stage, the second digital signals being generated by a last stage of said pipeline.

* * * * *